(12) United States Patent
Dake et al.

(10) Patent No.: US 7,026,854 B2
(45) Date of Patent: Apr. 11, 2006

(54) SYSTEM FOR PRODUCING HIGH-VOLTAGE, LOW-POWER DRIVER CIRCUITRY

(75) Inventors: Luthuli Edem Dake, Richardson, TX (US); Jozef Adut, New York, NY (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/851,007

(22) Filed: May 21, 2004

(65) Prior Publication Data

US 2005/0258876 A1    Nov. 24, 2005

(51) Int. Cl.
*H03K 5/08*    (2006.01)
(52) U.S. Cl. ........................................ 327/309; 327/326
(58) Field of Classification Search ................ 327/108, 327/306–307, 309–310, 312–328, 332; 326/82–83
See application file for complete search history.

(56) References Cited

U.S. PATENT DOCUMENTS

| | | | |
|---|---|---|---|
| 5,920,224 A * | 7/1999 | Preslar | 327/326 |
| 6,169,425 B1 * | 1/2001 | Spires et al. | 327/56 |
| 6,724,227 B1 * | 4/2004 | Imai | 327/108 |

* cited by examiner

*Primary Examiner*—My-Trang Nu Ton
(74) *Attorney, Agent, or Firm*—William B. Kempler; W. James Brady, III; Frederick J. Telecky, Jr.

(57) ABSTRACT

The present invention provides a system for producing high voltage, low power driver circuitry (300) that addresses a number of disparate design requirements. The present invention provides circuitry comprising a voltage supply (308) and an output node (302). A transistor (304) is provided. A first resistive element (312) is coupled to the voltage supply, while a second resistive element (314)—having a resistance value equal to that of the first resistive element—is coupled between a second terminal of the transistor and the output node. A first diode (310) is coupled to the first resistive element and to a first terminal of the transistor. A clamping system (316) is coupled to the transistor, and a current limiting system (318) is coupled to the clamping system.

19 Claims, 2 Drawing Sheets

SYSTEM FOR PRODUCING HIGH-VOLTAGE, LOW-POWER DRIVER CIRCUITRY

TECHNICAL FIELD OF THE INVENTION

The present invention relates generally to the field of semiconductor devices and, more particularly, to apparatus and methods for producing high-voltage, low-power driver circuitry.

BACKGROUND OF THE INVENTION

The continual demand for enhanced integrated circuit performance has resulted in, among other things, a dramatic reduction of semiconductor device geometries, and continual efforts to optimize the performance of every substructure within any semiconductor device. A number of improvements and innovations in fabrication processes, material composition, and layout of the active circuit levels of a semiconductor device have resulted in very high-density circuit designs. Increasingly dense circuit design has not only improved a number of performance characteristics, it has also increased the importance of, and attention to, semiconductor material properties and behaviors.

The increased packing density of the integrated circuit generates numerous challenges to the semiconductor manufacturing process. Nearly every device must be smaller without degrading operational performance of the integrated circuitry. High packing density, low heat generation, and low power consumption, with good reliability must be maintained without any functional degradation. Increased packing density of integrated circuits is usually accompanied by smaller feature size and, correspondingly, smaller device geometries.

At the same time, the use of electronic products and systems has spread into a number of new and distinct applications that, until recently, were not associated with electronic technology. Often, such new applications place a number of unique demands on components and substructures. Consider, for example, the radiation tolerance required of satellite or spacecraft systems, or the heat and shock tolerance required of automotive systems.

Thus, optimized performance over a broader range of operating conditions is required of many electronic components and substructures. This has resulted in a number of improvements and innovations in electronic systems, and has increased the importance of, and attention to, component and substructure properties and behaviors.

Commonly, system designers specify or define a number of required operational parameters (e.g., max/min voltage, signal timing) for certain circuitry segments in a system. Semiconductor devices (i.e., integrated circuits) must comply with such required parameters in order to be used in the system. For example, a system may require that a semiconductor device operate over supply voltage range of 0V to 40V, optimized for performance at 20V. In another example, a system may require that a semiconductor device provide a specified timing parameter (e.g., $t_{rise(MIN)}$, $t_{fall(MAX)}$).

Unfortunately, however, there are a large number of variables in semiconductor device manufacturing that can affect any given performance parameter. Intra-process variations, feature matching issues, and layout considerations are among a number of concerns that impact a device manufacturer's ability to provide a specified performance parameter. In some cases, a semiconductor device's standard operational parameters may be sufficient to provide a required performance level in a given system. In a number of other cases, however, a given system may require a very specific or peculiar performance parameter—such that an integrated circuit must be designed specifically for that application, if possible.

Consider, for example, a common low-side driver circuit utilized in a high-voltage application, having specific performance parameters. Depending upon the configuration of the driver circuit, surrounding circuitry, and required performance, a number of design or performance issues may arise. In a number of applications, an output node from the driver circuit can have a very large voltage swing—sometimes exceeding the driver circuit's own supply voltage level. Such excess can cause a voltage feedback condition, conducting charge back into the driver's voltage supply. This causes instabilities in the voltages supply, which degrades system performance and reliability. Furthermore, especially where such circuitry is implemented in high voltage applications, low power consumption is very important—particularly when portions of the driver circuitry may be in a standby (i.e., inactive) mode. Even fractionally inefficient circuitry can result in sizable power consumption during the operational lifetime of a device or system.

To the extent that a particular application may have specific or peculiar design or performance constraints, driver circuitry must further be adapted to address such concerns. Specific signal propagation timings, effective resistance values and other similar concerns can further impact or limit the design of driver circuitry. The same is true of certain semiconductor fabrication technologies. Design layout rules, process tolerances and variations and other similar, technology-specific issues must be comprehended even as the performance and reliability issues outlined above are also addressed.

In approaching these problems, designers using conventional system often address—either by choice or by process-specific limitations—only one or two of the most critical issues during the design of a device, while the remaining issues are left unaddressed. Once a design is complete and a device manufactured, those device may simply be screened or tested for compliance with all parameters. When a device is non-compliant, it is scrapped—degrading yield and increasing costs. Alternatively, designers may produce complicated solutions in an attempt to address all problems and requirements simultaneously. Unfortunately, however, such approaches often requirement substantial modification of or deviation from standard, high-volume semiconductor production processes. Such solutions thus end up being costly and inefficient.

As a result, there is a need for a system for producing high-voltage, low-power driver circuitry that is readily adaptable to address a variety of specific parametric requirements, while providing efficient and reliable device performance in an easy, efficient and cost-effective manner.

SUMMARY OF THE INVENTION

The present invention provides a versatile system, comprising various apparatus and methods, for producing high-voltage, low-power driver circuitry in commercially viable semiconductor process technologies. The system of the present invention comprehends specific parametric requirements and restrictions imposed by a certain application—addressing unique end-equipment needs while still providing a readily manufacturable device. Devices produced utilizing the system of the present invention thus provide reliable performance in an efficient and cost-effective manner.

Specifically, the present invention provides—within the system for producing high-voltage, low-power driver circuitry—a number of subsystems interoperably addressing separate performance or design issues. One such subsystem is provided to obviate charge feedback into the circuitry voltage supply during overvoltage on the output node. Another subsystem provides a desired equivalent resistance at the output. Other subsystems facilitate high voltage and low power operation of the driver circuitry and other subsystem(s).

More specifically, one embodiment of the present invention provides a high voltage driver circuitry segment, comprising a transistor having first, second and third terminals. An internal voltage supply and output node are provided. A back-feed blocking system is coupled between the first terminal and the internal voltage supply. An equivalent resistance system is coupled between the voltage supply and the output node, and coupled to a terminal of the transistor. A clamping system is provided, coupled between the first and third terminals of the transistor, and a current dissipation system is coupled to the clamping system.

Another embodiment of the present invention provides a circuit having a voltage supply, an output node and a transistor having first, second and third terminals. A first resistive element is coupled to the voltage supply. A first diode is coupled to the first resistive element and to the first terminal of the transistor. A second diode is coupled between the first and third terminals of the transistor. A second resistive element, having a resistance value equal to that of the first resistive element, is coupled between the second terminal of the transistor and the output node. A low power current mirror circuit is provided, and overvoltage protection system is coupled between the third terminal of the transistor and the low power current mirror circuit.

The present invention further provides a method of producing high voltage driver circuitry, which provides a transistor having first, second and third terminals, an internal voltage supply, and an output node. A back-feed blocking system is provided, coupled between the first terminal and the internal voltage supply. An equivalent resistance system is provided, coupled between the voltage supply and the output node, and coupled to a terminal of the transistor. A clamping system is provided, coupled between the first and third terminals of the transistor, and a current limiting system is provided, coupled to the clamping system.

Other features and advantages of the present invention will be apparent to those of ordinary skill in the art upon reference to the following detailed description taken in conjunction with the accompanying drawings.

BRIEF DESCRIPTION OF THE DRAWINGS

For a better understanding of the invention, and to show by way of example how the same may be carried into effect, reference is now made to the detailed description of the invention along with the accompanying figures in which corresponding numerals in the different figures refer to corresponding parts and in which.

DETAILED DESCRIPTION OF THE INVENTION

While the making and using of various embodiments of the present invention are discussed in detail below, it should be appreciated that the present invention provides many applicable inventive concepts, which can be embodied in a wide variety of specific contexts. The present invention is hereafter illustratively described primarily in conjunction with the formation of a low side FET driver circuit implemented in a CMOS semiconductor process, although it may be generally applied to a number of circuits. The teachings and embodiments of the present invention may be utilized for any type of semiconductor device or structure that is capable of implementing such teachings and embodiments in a beneficial manner. The specific embodiments discussed herein are, therefore, merely demonstrative of specific ways to make and use the invention and do not limit the scope of the invention.

The present invention provides a versatile system with which high-voltage, low-power driver circuitry may be efficiently produced in commercially viable semiconductor process technologies. For a given application, the system of the present invention comprehends a number of specific and disparate parametric requirements and restrictions imposed by that application—addressing unique end-equipment needs while still providing a readily manufacturable device.

According to the present invention, a number of subsystems interoperably address separate performance or design issues within the driver circuitry. One such subsystem obviates charge feedback, originating from the driver's output node (e.g., during an overvoltage on output). By this subsystem, voltage supply internal to the driver circuitry is protected from the charge feedback. Another subsystem provides a desired equivalent resistance at the output. Other subsystems facilitate high voltage and low power operation of the driver circuitry and other subsystem(s). These subsystems and other aspects of the present invention are implemented efficiently within most semiconductor process technologies—resulting in minimal fabrication overhead. The present invention thus addresses issues of concern in a commercially viable manner.

Figure 1:
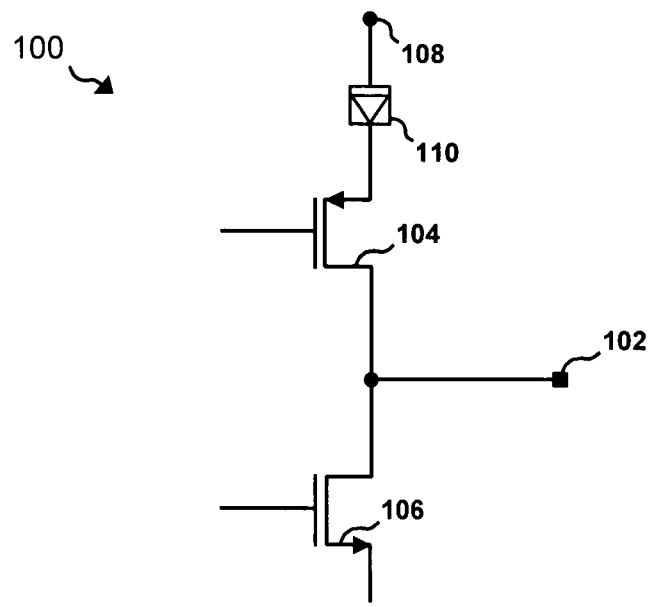
FIG. 1 provides an illustration depicting one embodiment of a driver circuitry design in accordance with certain aspects the present invention.

Although the present invention may be utilized to the benefit of a number of device structures and features, it is useful—for the purposes of illustration and explanation—to consider the present invention in relation to the formation and performance of a low-side FET driver circuit produced in a CMOS process. Certain aspects of the present invention are therefore illustrated now with reference to circuitry segment 100 as depicted in FIG. 1. Segment 100 represents a portion of a low-side driver circuit designed to drive an output node 102 in a high voltage application. In most applications, node 102 is coupled to circuitry external to the semiconductor device that contains segment 100. Depending upon the application, output node 102 may be coupled to, and swing over, a relatively large voltage range, and may experience both positive and negative voltages. For example, node 102 may have a potential voltage range of −20V to +40V, resulting in a voltage range value of 60V.

The driver circuit comprises first and second transistors 104 and 106, respectively. Segment 100 has a fixed internal voltage supply 108. Supply 108 is provided at some voltage suitable for the particular application for which segment 100 is utilized. For example, supply 108 may be provided at +20V. During normal operation, segment 100 operates to pull node 102 up to the supply voltage level (e.g., +20V) at supply 108. Given the high potential voltage range of output 102, however, it is possible that the voltage at node 102 may exceed the supply voltage level, by a significant amount (~20V) in some cases. In such cases, without benefit of the present invention, charge from node 102 can feed back into supply 108 causing instability in the internal voltage supply and resulting in a variety of reliability and performance issues. According to the present invention, however, segment 100 comprises a back-feed blocking component 110—provided to obviate any charge back-feed into supply 108. In the embodiment illustrated in FIG. 1, component 10 is depicted as a diode, having its anode coupled to supply 108 and its cathode coupled to a first terminal of transistor 104 (i.e., the source of transistor 104). Component 110 is a high voltage device rated at a voltage sufficient to compensate for any potential back-feed from node 102 (e.g., 60V). In other embodiments, component 110 may be provided as any other suitable semiconductor device or structure capable of obviating back-feed charge from node 102 to supply 108.

Depending upon the configuration and composition of component 110, relative to the rest of segment 100, certain parasitic coupling issues may arise. Particularly in instances where component 110 is implemented as a diode, certain operational modes of segment 100 can result in detrimental current flow from the substrate through a diode. In instances where node 102 is at a voltage level lower than that of the semiconductor substrate (i.e., when the voltage at node 102 is negative), parasitic coupling through the substrate may cause current to flow from the substrate into the driver circuitry or voltage supply. This can cause a number of critical performance issues—particularly device latch-up—that can render a semiconductor device effectively or completely useless.

Recognizing this, the present invention provides a switching function that limits any parasitic current path when node 102 goes negative. In the embodiment illustrated in FIG. 1, the switching function is provided in the form of PMOS transistor 104. During operation, if node 102 does go negative, transistor 104 shuts off. Parasitic current conduction, otherwise occurring at the anode of component 110, has no current flow path, and latch-up is thus prevented. In other embodiments, other suitable types of semiconductor structures may be provided as the switching function, provided that similarly limit parasitic current flow when node 102 is at a negative value.

Figure 2:
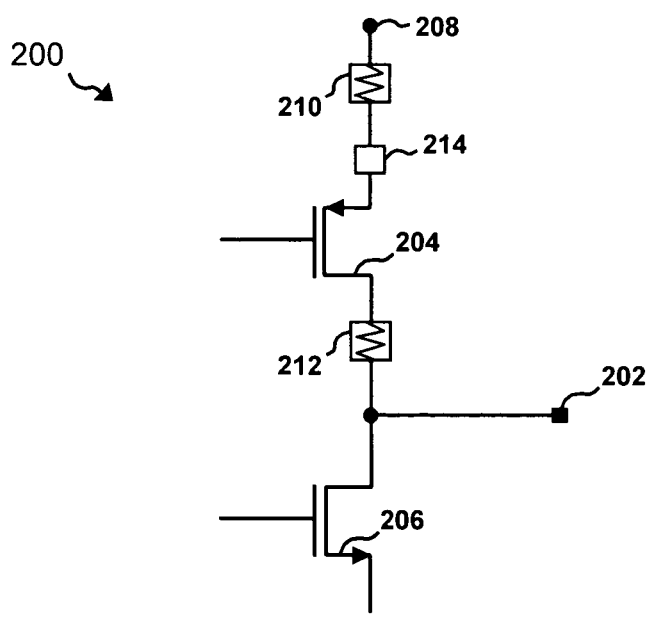
FIG. 2 provides an illustration depicting another embodiment of a driver circuitry design in accordance with certain aspects the present invention.

Certain other aspects of the present invention are illustrated now with reference to circuitry segment 200 as depicted in FIG. 2. Similar to segment 100, segment 200 represents a portion of a low-side driver circuit designed to drive an output node 202 in a high voltage application. In certain applications, equipment or systems coupled to node 202 require some predetermined equivalent resistance value (R) at that node. In high voltage applications, (R) may have a relatively high value (e.g., 30 kΩ). Again, output node 202 may be coupled to, and swing over, a relatively large voltage range, and may experience both positive and negative voltages. For example, node 202 may have a potential voltage range of −20V to +40V, resulting in a voltage range value of 60V.

The driver circuit comprises first and second transistors 204 and 206, respectively. Segment 200 has a fixed internal voltage supply 208. Supply 208 is provided at some voltage suitable for the particular application for which segment 200 is utilized. For example, supply 208 may be provided at +20V.

The present invention provides the equivalent resistance (R) at node 202 by dividing that resistance between two optimally placed resistive elements 210 and 212. In the embodiment illustrated in FIG. 2, elements 210 and 212 are depicted as resistors, although other semiconductor structures or devices behaving in accordance with the present invention may be utilized in alternative embodiments. Element 210 is coupled between supply 208 and a back-feed blocking component 214. Element 212 is coupled between a second terminal of transistor 204 (i.e., the drain of transistor 204) and node 202.

Elements 210 and 212 are high voltage device structures. Each is provided at a resistance value of (R/2), and placed at opposite terminals (i.e., drain and source terminals) of transistor 204. In this manner, the present invention addresses several potential performance issues. Primarily, the placement and matched value of elements 210 and 212 provide proper bias balance (i.e., $V_{GS}$) for transistor 204 to function in a switching capacity. Secondarily, utilization of smaller resistive elements simplifies device layout and provides designers with greater flexibility to address device-matching issues due to process variations.

Although the driver circuit segments illustrated above function within a high voltage environment, many applications require driver circuitry to have low power consumption. These competing demands can present a number of challenges for designers. Circuitry segment 300, as depicted in FIG. 3, illustrates several aspects of the present invention addressed to balancing high voltage and low-power concerns.

Similar to segments 100 and 200, segment 300 represents a portion of a low-side driver circuit designed to drive an output node 302 in a high voltage application. For purposes of illustration, the embodiment represented by segment 300 incorporates certain requirements and features of the embodiments illustrated by segments 100 and 200. Thus, segment 300 provides some predetermined equivalent resistance value (R) at node 302. Node 302 may be coupled to, and swing over, a relatively large voltage range, and may experience both positive and negative voltages.

Figure 3:
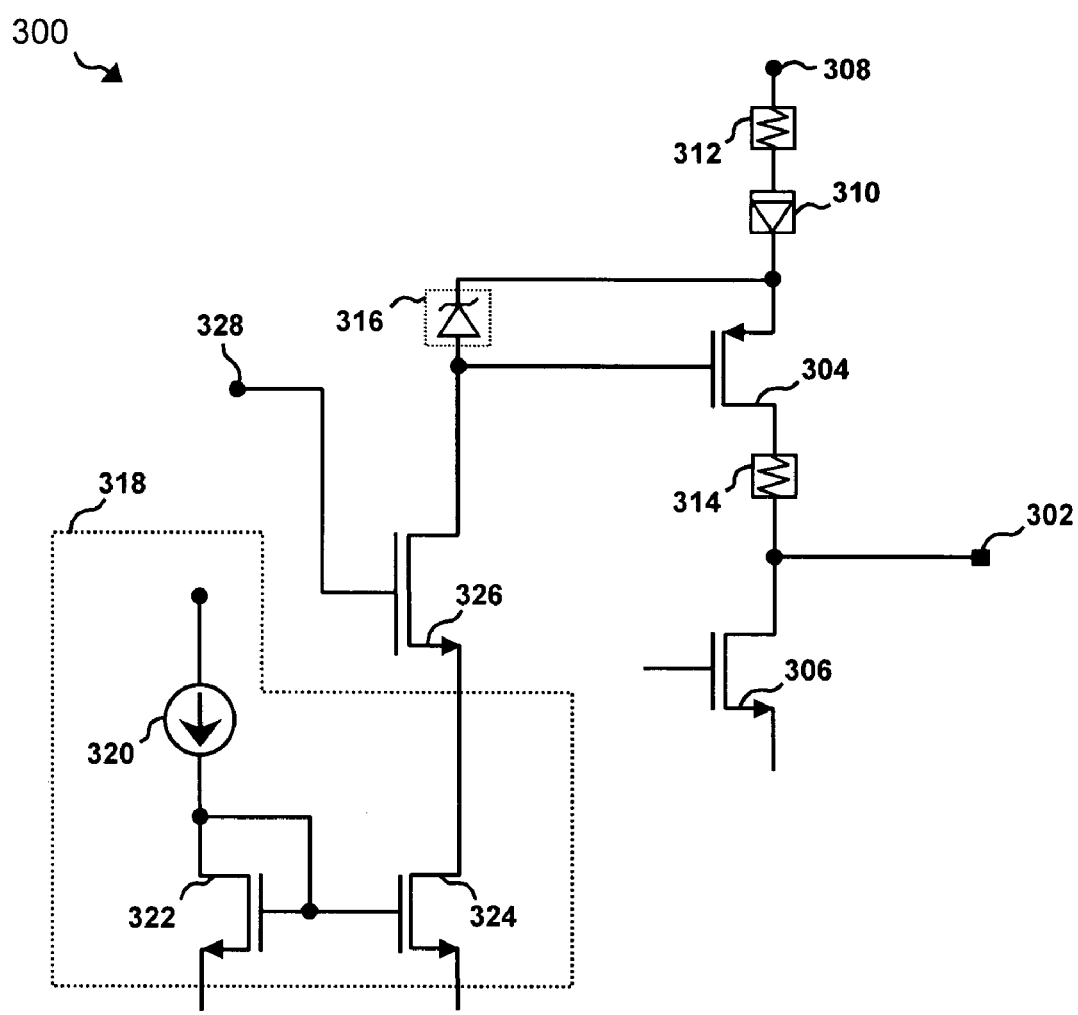
FIG. 3 provides an illustration depicting another embodiment of a driver circuitry design in accordance with certain aspects the present invention.

The driver circuit depicted in FIG. 3 comprises first and second transistors 304 and 306, respectively. Segment 300 has a fixed internal voltage supply 308. Supply 308 is provided at some voltage suitable for the particular application for which segment 300 is utilized (e.g., +20V). Segment 300 further comprises a back-feed blocking element 310, depicted in FIG. 3 as a diode, and resistive elements 312 and 314, depicted in FIG. 3 as resistors. In other embodiments, as previously described, elements 310, 312 and 314 may comprise a variety of suitable semiconductor structures or devices behaving in accordance with the present invention. Element 312 is coupled between supply 308 and element 310. Element 310 is coupled between element 312 and a first terminal of transistor 304 (i.e., the source of transistor 304). Element 314 is coupled between a second terminal of transistor 304 (i.e., the drain of transistor 304) and node 302. Elements 312 and 314 are high voltage device structures, provided at a resistance value of (R/2).

As with the embodiment illustrated in FIG. 1, transistor 304 is provided as a PMOS type transistor. Within a high voltage application, transistor 304 is exposed to relatively large voltage swings and differentials. Without benefit of the present invention, the semiconductor structures that comprise transistor 304—particularly the gate oxide—are susceptible to break down and damage due to high voltage. Furthermore, even where permanent damage is not done to transistor 304, its parametric performance can shift and cause device or system performance issues. For example, depending upon the voltages at nodes 302 and 308, the effective resistance across transistor 304 may vary enough to shift the effective resistance of segment 300, vis-à-vis node 302, away from the value (R).

According to the present invention, however, transistor 304 is protected structurally and parametrically from high voltage degradations by a clamping system 316. System 316 clamps the gate/source voltage ($V_{GS}$) of transistor 304 to some desired level (e.g., 12V). The desired clamping voltage of system 316 may be determined or based on a number of factors, such as the operational voltage levels for the application within which segment 300 is utilized, or the maximum desired shift in resistance across transistor 304. Operationally, system 316 limits the $V_{GS}$ of transistor 304 to the desired clamping level ($V_{clamp}$). To the extent that the voltage across transistor 304 would otherwise exceed $V_{clamp}$, clamping system 316 dissipates excess current through current limiting system 318.

As depicted in FIG. 3, system 316 comprises a Zener diode, coupled between the gate and source of transistor 304. In alternative embodiments, other suitable types of semiconductor structures (e.g., a controlled p-n junction) may be provided as the clamping system, provided that they function in accordance with the present invention. Operationally, when $V_{GS}$ of transistor 304 reaches $V_{clamp}$, the Zener diode enters breakdown mode and excess current is limited by system 318. The $V_{GS}$ of transistor 304 is held at $V_{clamp}$ and, thus, the effective resistance across transistor 304 does not vary appreciably.

System 318 may be provided as any suitable structure or device for safely and efficiently limiting excess current from system 316. For purposes of illustration, system 318 is depicted in FIG. 3 as a current limiting current mirror. With this embodiment, the present invention addresses a need for low power operation of segment 300, despite its operation within a high voltage application. Furthermore, this particular configuration affords a relatively high degree of control of the performance of segment 300, as explained hereinafter.

As depicted in FIG. 3, system 318 comprises a current source 320, and third and fourth transistors 322 and 324, respectively. Current source 320 sources current that limits the amount of current that system 318 dissipates. Source 320 comprises any suitable current source capable of providing varying current in accordance with the present invention. In certain embodiments, source 320 may comprise circuitry (e.g., another driver circuit) dedicated solely operation within segment 300. In other embodiments, source 320 may comprise circuitry, coupled to segment 300, that is independent therefrom. In the embodiment depicted in FIG. 3, transistors 322 and 324 are NMOS transistors, configured in a current-mirror topography, that limit excess current in system 316. In the embodiment of segment 300, system 318 itself is provided as a low power system (e.g., ~ several μA dissipation). Transistors 322 and 324 are therefore provided as low voltage (e.g., ~6V) devices.

Given the high voltage operation of the other components of segment 300, however, the present invention further provides an overvoltage protection system 326, to protect system 318 from damage. In the embodiment depicted in FIG. 3, system 326 is depicted as a high voltage (e.g., ~60V) NMOS transistor with its gate coupled to a low voltage supply 328 (e.g., ~6V). System 326 is designed, placed or otherwise adapted to limit voltage levels experienced by system 318 (i.e., transistor 324).

As with the embodiments depicted in FIGS. 1 and 2, segment 300 may be implemented utilizing a number of alternatives to those depicted in FIG. 3. For example, the systems of the present invention may be implemented in MOS types complementary to those illustrated (e.g., utilize PMOS instead of NMOS, and vice versa), or implemented at parametric values different from the examples given (e.g., at lower or higher voltages), depending upon the specific needs of a system or application for which the present invention is utilized.

Thus, the present invention provides a versatile system with which high-voltage, low-power driver circuitry may be efficiently produced in commercially viable semiconductor process technologies. Comprehending specific parametric requirements and restrictions imposed by a particular application, the system of the present invention provides a number of subsystems interoperably addressed to those limitations within the driver circuitry. Subsystems, and other aspects, of the present invention are implemented efficiently within most semiconductor process technologies—resulting in minimal fabrication overhead. The present invention thus addresses issues of concern in a commercially viable manner.

The embodiments and examples set forth herein are therefore presented to best explain the present invention and its practical application, and to thereby enable those skilled in the art to make and utilize the invention. However, those skilled in the art will recognize that the foregoing description and examples have been presented for the purpose of illustration and example only. The description as set forth is not intended to be exhaustive or to limit the invention to the precise form disclosed. As stated throughout, many modifications and variations are possible in light of the above teaching without departing from the spirit and scope of the following claims.

What is claimed is:

1. A high voltage driver circuitry segment comprising:
a transistor having first, second and third terminals;
an internal voltage supply;
an output node;
a back-feed blocking system comprising a diode, coupled between the first terminal and the internal voltage supply;
an equivalent resistance system, coupled between the voltage supply and the output node, and coupled to a terminal of the transistor;
a clamping system, coupled between the first and third terminals of the transistor; and
a current limiting system, coupled to the clamping system.

2. The circuitry segment of claim 1, wherein the transistor comprises a PMOS transistor, and the first, second and third terminals comprise the source, drain and gate, respectively.

3. The circuitry segment of claim 1, wherein the equivalent resistance system comprises a resistor.

4. The circuitry segment of claim 3, wherein the equivalent resistance system comprises a resistor coupled between the voltage supply and the first terminal.

5. The circuitry segment of claim 3, wherein the equivalent resistance system comprises a resistor coupled between the output node and the second terminal.

6. The circuitry segment of claim 3, wherein the equivalent resistance system comprises:
a first resistor coupled between the voltage supply and the first terminal; and a second resistor coupled between the output node and the second terminal.

7. The circuitry segment of claim 6, wherein the first and second resistors are of a matched value.

8. The circuitry segment of claim 1, wherein the clamping system is adapted to clamp the transistor at a desired clamping voltage.

9. The circuitry segment of claim 8, wherein the clamping system comprises a zener diode, having a breakdown voltage equivalent to the desired clamping voltage.

10. The circuitry segment of claim 1, wherein the current limiting system comprises a current mirror circuit.

11. The circuitry segment of claim 10, wherein the current mirror circuit comprises a dedicated current source.

12. The circuitry segment of claim 10, wherein the current mirror circuit is coupled to an independent current source.

13. The circuitry segment of claim 10, wherein the current mirror circuit comprises a plurality of low voltage NMOS transistors.

14. The circuitry segment of claim 13, wherein the current limiting system further comprises an overvoltage protection system coupled between the current mirror circuit and the clamping system.

15. The circuitry segment of claim 14, wherein the overvoltage protection system comprises a high voltage NMOS transistor.

16. A circuit comprising:
a voltage supply;
an output node;
a transistor having first, second and third terminals;
a first resistive element, coupled to the voltage supply;
a first diode coupled to the first resistive element and to the first terminal of the transistor;
a second diode coupled between the first and third terminals of the transistor;
a second resistive element, having a resistance value equal to that of the first resistive element, coupled between the second terminal of the transistor and the output node;
a low power current mirror circuit; and
an overvoltage protection system coupled between the third terminal of the transistor and the low power current mirror circuit.

17. The circuit of claim 16, wherein the second diode is a Zener diode.

18. The circuit of claim 16, wherein the transistor is a PMOS transistor.

19. A method of producing high voltage driver circuitry, the method comprising the steps of:
providing a transistor having first, second and third terminals;
providing an internal voltage supply;
providing an output node;
providing a back-feed blocking system comprising a diode, coupled between the first terminal and the internal voltage supply;
providing an equivalent resistance system, coupled between the voltage supply and the output node, and coupled to a terminal of the transistor;
providing a clamping system, coupled between the first and third terminals of the transistor; and
providing a current limiting system, coupled to the clamping system.

* * * * *